United States Patent

Van-Hecke et al.

[11] Patent Number: 4,667,094
[45] Date of Patent: May 19, 1987

[54] OPTICAL INDICATOR SYSTEM FOR AIRCRAFT PALLET CONNECTOR-MATING

[75] Inventors: Christian Van-Hecke, Boutigny sur Essonne; Denis Pavie, Ballancourt sur Essonne, both of France

[73] Assignee: Vibrachoc, Evry, France

[21] Appl. No.: 752,706

[22] Filed: Jul. 8, 1985

[30] Foreign Application Priority Data

Jul. 9, 1984 [FR] France ................ 84 10860

[51] Int. Cl.[4] .................. G01N 9/04; H01J 5/16
[52] U.S. Cl. ................ 250/223 R; 250/227; 339/113 L
[58] Field of Search ......... 339/113 L; 200/50 R, 200/61.62, 61.02, 61.19; 250/561, 223 R, 227

[56] References Cited

U.S. PATENT DOCUMENTS

| 3,649,839 | 3/1972 | Appleton | 250/215 |
| 3,969,609 | 7/1976 | Wanner et al. | 339/113 L |
| 4,047,781 | 9/1977 | DeNigris et al. | 339/113 L |
| 4,217,530 | 8/1980 | Dahm | 250/561 |
| 4,332,990 | 6/1982 | Stevens | 200/314 |

Primary Examiner—David C. Nelms
Assistant Examiner—William L. Oen
Attorney, Agent, or Firm—Sughrue, Mion, Zinn, Macpeak and Seas

[57] ABSTRACT

One or more microswitches (9) are mounted on the back wall (2) of an aircraft electronics equipment pallet or tray, to be actuated by the rear panel (7) of a slide-in electronics unit (6) when the latter's rear panel connectors correctly mate with the connectors on the back wall of the receiving tray, thus electrically or optically connecting photosensitive means with luminous indicating means.

5 Claims, 4 Drawing Figures

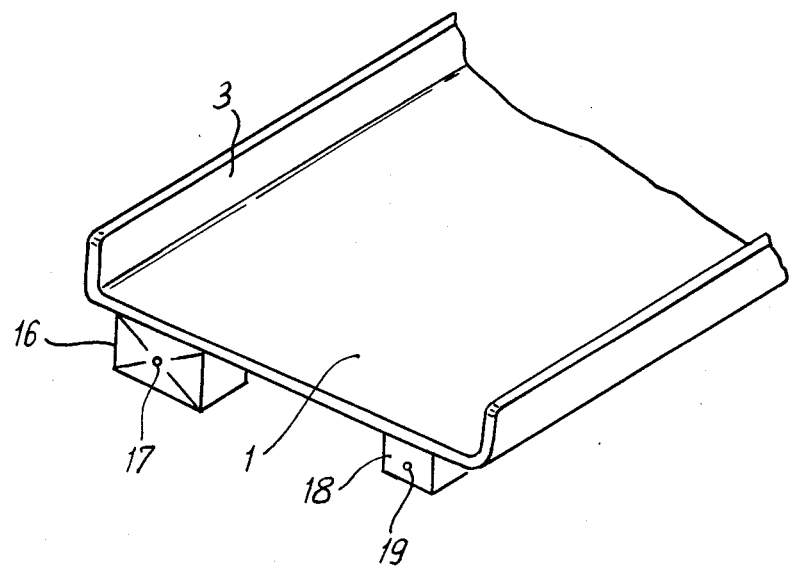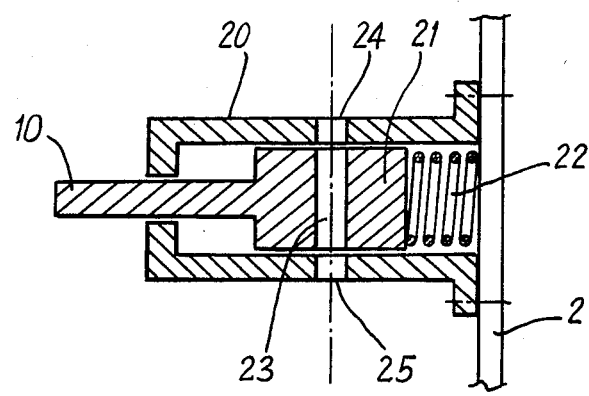

OPTICAL INDICATOR SYSTEM FOR AIRCRAFT PALLET CONNECTOR-MATING

FIELD OF THE INVENTION

This invention relates to a device for indicating when electrical connectors on an aircraft tray or pallet for electronics units are mated.

BACKGROUND OF THE INVENTION

An aircraft pallet is generally a tray arranged horizontally on a shelf, designed to support electronic apparatus or avionics units enclosed in a boxlike case. Accordingly, the pallet comprises slideways enabling the avionics unit to be inserted therein by sliding from front to back, the latter's bottom sliding on the pallet or tray itself during installation. The slideway may consist merely of the top surface of the pallet and two side shoulders guiding the unit. At the back of the pallet is a vertical wall carrying the electrical connector or connectors intended to mate with matching connectors on the rear panel of the pallet-mounted avionics unit.

Hinged locks are generally provided to lock the electronics unit in its final pushed-back or home position, such locks sometimes being operable to help slide the unit inwards or outwards on the pallet, in which case they are commonly equipped with releasing means which cut out the transmission of the pushing-in force normally transmitted by the hinged lock to the electronics unit when an installer meets a certain sufficient resistance which should correspond to full mating of the connector halves.

In most aircraft, a plurality of avionics units are arranged side by side, generally on a rack, with tight spacing between them. The operator or pilot therefore can see only the front panels of the units and can never be certain whether a unit is duely and fully pushed in for perfect mating of the aforementioned connectors and adequate electrical connection. The use of hinged locks is intended to obviate this disadvantage. However, the lock mechanism can still release prior to actual mating of the connectors, or without full engagement together of said connectors, conveying a false sense of security that will not preclude an avionics malfunction due to a poor connection. Obviously, the problem is aggravated when non-standard or different standard-sized electronics units are installed together.

Assignee has already proposed, in French published patent application FR-A-2546676, a connector mating indicator consisting of a detector, placed near the back panel of the aircraft pallet, which slides between a forward position and a backward position corresponding to the rearmost position of the electronics unit rear panel at which connector mating is fully effected, said detector being connected to the rear end of a long lateral tongue or strip guided along the pallet, the forward end whereof is colored and is visible at the front of the pallet when the detector is in forward position and disappears from sight when the detector is backed to the rear of the pallet or tray.

The present invention is directed to obviating the disadvantages of the prior art devices and to using mechanical indication means towards this purpose to the least possible extent.

Another object of the invention is to enable an operator to visually determine whether the hidden connectors are correctly mated with the help of an external light source such as a flashlight.

Still another object of the invention is to enable the operator to visually determine whether connector mating is adequate, without powering up the device.

SUMMARY OF THE INVENTION

The invention provides a system for indicating when electrical connectors at the back of an aircraft pallet are mated, said pallet comprising a bottom panel forming the pallet itself, a rear connector panel, lateral guiding means for the equipment therein, such as shoulders thereon, to receive an avionics unit or case with mating connector parts on its rear panel, said device consisting of light-sensitive means disposed near the front edge of the pallet, indicating means also disposed near the front edge of the pallet, conducting means, between said light-sensitive means and said indicating means, operable to transmit to the latter a signal bringing about their activation in the event light impinges upon the light-sensitive means, and a switch, preferably located on the pallet's inside panel, with activating means such as a pushbutton also to be pushed in against suitable spring means by a corresponding part of the case of said unit, in particular by the rear panel of said case, when the latter reaches its rearmost engagement position corresponding to the home position of the unit associated with correct mating of the connectors, said switch normally interrupting the transmission of said signal and conversely allowing said transmission when it is actuated by the said part of the case reaching said home position.

The light-sensitive means may consist of photoelectric means connected to an electrical conductor feeding the switch, in this case a microswitch, said conductor thereafter continuing beyond the microswitch, to the indicating means so as to supply the latter an electric signal when the microswitch is in signal-passing position, said signal consisting of the current generated by said photoelectric means when light shines thereon.

Alternatively, said light-sensitive means consist of the ends of one or more light guiding fibers, said fiber or fibers forming a first length being then routed to the switch, being in this case an optical switch, another length of optical fiber(s) going from said switch to the indicating means, when can consist simply of the end or ends of the optical fiber or fibers of the second length, set in a panel of a preferably dark color.

Preferably, said light-sensitive means and said indicating means are arranged beneath the front edge of the pallet. They are also preferably spaced apart from one another so that a user can direct light from a light source such as a flashlight at the sensitive means, said two different means being preferably disposed one at each end of the front edge of the pallet to leave an open space at the center for placement of suitable locking means, as required.

A plurality of microswitches can be useed instead of a single such switch, said plurality of switches being connected either in parallel to ensure correct operation of the indicating means even if one of the microswitches is damaged, or in series, to prevent a failing switch, stuck in contacting position, giving a wrong indication of positive connector mating.

Other features and advantages of the invention will become apparent from the following description, given by way of example only, with reference to the accompanying drawings.

BRIEF DESCRIPTION OF THE DRAWINGS

FIG. 3 is a perspective view of the front part of the pallet equipped with means according to another embodiment of the invention;

and FIG. 4 is a schematic illustration of an optical switch being part of the device of FIG. 3.

Figure 1:
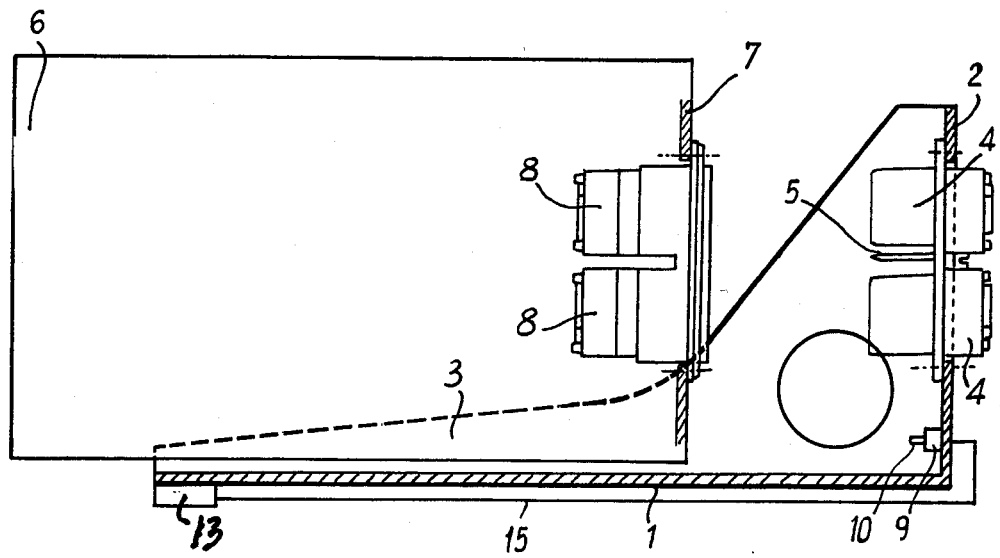
FIG. 1 is a schematic side elevation of an aircraft flight deck equipment pallet or tray equipped with the photoelectric means for detecting and indicating connector mating according to the invention.
Figure 2:
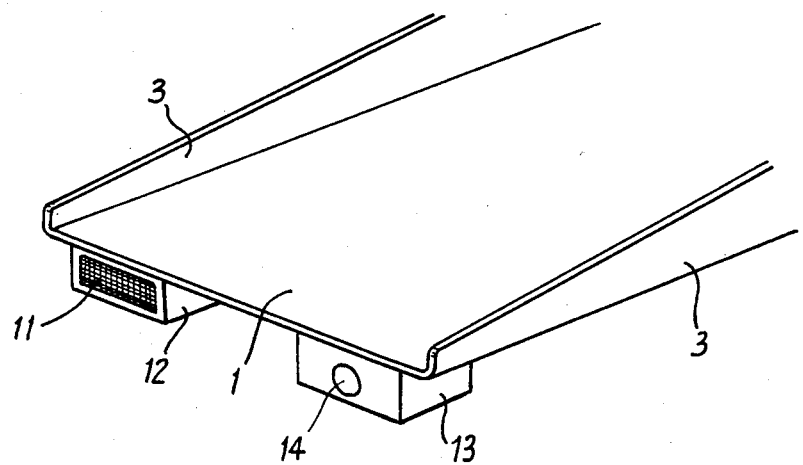
FIG. 2 is a perspective view of the front part of the pallet or tray of FIG. 1.

The aircraft equipment tray shown, which is generally mounted alongside several other identical trays in a rack, consists of a horizontal base plate 1 with a vertical riser or back wall 2 and two stiffening side panels 3 whose shape is clearly outlined in FIG. 1. The back wall 2, whose inside face constitutes a reference plane, carries connector halves 4 designed to plug in horisontally and can further be provided with guding and/or polarizing means 5.

The electronics equipment is enclosed in a boxlike case 6 having various adjusting and setting and display means on its front panel, as well as means, not shown, designed for locking with any suitable known engaging and locking means when it is suitably positioned on the pallet. The rear panel 7 of the electronics case 6 also serves as a reference plane. It is equipped with connector halves 8 designed to mate with connector halves 4 and it is readily apparent that if the case 6 is made to slide towards back wall 2 on horizontal base plate 1 and guidably between side panels 3, respective connector halves 4 and 8 will eventually mate to effect the desired electrical connection.

As previously explained, it is important that the axial positioning of case 6 on pallet 1 in a locked state correspond with a correct mating of the connector halves and consequently with a high probability of satisfactory electrical contact. In other words, taking into account the manufacturing tolerances, when the case 6 is in home position on the tray, the horizontal distance between the front face of back wall 2 and the back face of rear panel 7 must be of a well-defined value within a tight tolerance, particularly in the direction of extraction or leftwardly in FIG. 1.

In accordance with the invention, at least one microswitch 9 with its pushbutton or plunger 10 is mounted on the tray, preferably against the back wall 2, and in this case preferably at a certain height above the level of the horizontal bottom plate 1, and arranged axially, ie. horizontally, such that when the rear face of case 6 rear panel 7 has reached its optimum position, plunger 10 will have been pushed back (in), establishing the contact within switch 9.

According to the invention, one or more photocells, generally represented by reference 11 and contained in a suitable housing 12 are attached to the underside of horizontal plate 1, at a front corner thereof near a side panel 3. Similarly, a housing 13 containing at least one indicator means 14, for example an indicator lamp or backlightable inscription, is attached beneath the opposite front corner of plate 1. The two housings must have sufficient space between them to allow locking means to be installed therebetween.

Suitable leads or conductors such as 15, represented highly schematically in the figure, connect the photocell unit 11 to the switch 9 on the one hand and the switch 9 to the light source or sources 14 on the other hand. Thus the electric circuit going from the photocells to the light source is normally interrupted by microswitch 9 as long as plunger 10 thereof is not pushed.

If however, the operator having slid an electronics unit 6 home over the tray to the back wall, switch 9 plunger 10 is pushed in, switch 9 will now complete the circuit between photocell 11 and light source 14. To check for correct mating of the connector havles 4, 8, one need only shine a light on said photocells 11. These will generate current, which will flow through switch 9—if case 6 is correctly plugged in—to light source 14, which will light up.

It is generally preferred, though not an actual requirement, to use photocells not responsive to the ordinary indirect lighting around the aircraft electronic equipment trays. The operator who has installed the electronics unit 6 on the tray must then use a flashlight or other portable light source to illuminate the photocell unit 11, and check that such illumination is repeated at the light source or indicator 14.

The indicator light source 14, as previously mentioned, can consist of one or more indicator lamps, for example green-colored lamps, or instead can be a graphic symbol or inscription.

Preferably, a plurality of microswitches like item 9 are used so that even if one of them is damaged, the desired light indication can be obtained as long as one switch remains operational.

According to another embodiment of the invention, several microswitches can be connected in series to prevent the accidental engagement of one switch from producing a false positive response.

Referring to FIG. 3, this shows the front panel of an aircraft electronic equipment pallet or tray 1 according to an alternative embodiment of the invention. In the location formerly occupied by a photoelectric unit 12, there is now a housing 16 having a collector 17 in the center thereof for optical fibers. Said collector 17 is of a known type designed to transmit to a bundle of optical fibers the light which it collects whenever the front of housing 16 is exposed to light at a variable incidence, such as for example to a flashlight beam.

Indicator housing or unit 13 of the previous embodiment is replaced by a housing 18 the front face whereof is equipped with a luminous indicator which may be a fiber optical amplifier and/or diffuser.

Microswitch 9 of the previous embodiment is replaced by an optical switch 20 suitably disposed on back wall 2, with a slide 21 therein driven against a spring 22 by plunger 10, the latter's position at rest being the same as for the plunger of FIG. 1. Slide 21 contains a cross-passage 23 which, in the pushed back or pushed in position of the switch plunger by avionics unit 6, aligns with two openings 24, 25 in the switch housing, passing light therethrough. In the rest position of the switch, spring 22 pushes back slide 21, or more accurately pushes it forward, out of alignment with openings 24 and 25.

At opening 24 issues the end of a first length of optical fiber bundle the other end whereof is fitted into housing 16 to receive the light from collector 17. Accordingly, when optical switch 20 is in the position shown in FIG. 4, illumination of collector 17 by a flashlight sends light along the optical fiber bundle to opening 24, then through passage 23 to opening 25 wherein is located a collector for a second fiber bundle installed between opening 25 and housing 18 where it delivers light to luminous indicator 19. Thus illuminating the front face of unit 16 with a flashlight produces a luminous indication on the front face of unit 18 only when the switch is in a position corresponding to a perfect mating of the respective connector halves on the avionics unit and on the electronic equipment pallet.

Obviously, the position and arrangement of the light-sensitive means and of the indicating means designed to be activated by illumination of the first-mentioned means can be modified, provided they are preferably kept sufficiently apart so that a light shined on the first will not also illuminate the second.

It should be understood that although the invention has been described in terms of a preferred embodiment, this embodiment does not limit the scope of the invention and various modifications may be made to the materials thereof and their arrangement without departing from the scope and spirit of the invention as defined in the following claims.

What is claimed is:

1. A system for indicating when electrical connectors at the back of an aircraft pallet are mated, said pallet comprising a base plate forming the pallet proper and having a front edge, a pallet back wall carrying electrical connector means, and guide panels defining lateral guiding means, said pallet receiving a boxlike unit case of electronics equipment having a rear panel and mating connector means on said rear panel, said system comprising; light-sensitive means disposed near the front edge of the pallet, connector mating indicating means also disposed near the front edge of the pallet, a light impingement signal conducting means between said light-sensitive means and said connector mating indicating means for transmitting to the latter a light impingement signal for activating said connector mating indicating means in the event light impinges upon the light-sensitive means, and a switch having spring biased means pushed back against the spring bias by said rear panel thereof, when said unit case arrives at its rearmost mounting or home position, said position being that in which the connector mating is fully effected between said connector means of said pallet back wall and said mating connector means of said unit case rear panel, said switch spring biased means normally positioned within said switch for interrupting the transmission of said light impingement signal and conversely allowing transmission of said signal when said spring biased means is actuated by said rear panel of the unit case reaching said home position.

2. The system according to claim 1, wherein said light-sensitive means are photoelectric means, said switch is an electric microswitch, said connector mating indicating means are electrically operated indicating means, and said light impingement signal conducting means are electrical conductors which link said light-sensitive means and said indicating means through said electric microswitch.

3. The system according to claim 1, wherein said light-sensitive means are optical means, said indicating means are optically operated indicating means, said switch is an optical switch, and said light impingement signal conducting means comprises an optical fiber bundle linking said optical means, via said optical switch, to said indicating means.

4. The system according to claim 1 or 3, wherein said light-sensitive means and said indicating means are mounted beneath said front edge of said aircraft equipment pallet.

5. The system according to claim 4, wherein said light-sensitive means and said indicating means are spaced apart so that a light can shine on said light-sensitive means without shining at the same time on said indicating means.

* * * * *